(12) United States Patent
Deutscher et al.

(10) Patent No.: US 7,852,118 B2
(45) Date of Patent: Dec. 14, 2010

(54) HIGH SPEED CONDITIONAL BACK BIAS VIRTUAL GROUND RESTORATION CIRCUIT

(75) Inventors: Neil Deutscher, Tempe, AZ (US); Jinhui Chen, Chandler, AZ (US); Marquis Jones, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/629,237

(22) Filed: Dec. 2, 2009

(65) Prior Publication Data

US 2010/0148818 A1 Jun. 17, 2010

Related U.S. Application Data

(60) Provisional application No. 61/121,977, filed on Dec. 12, 2008.

(51) Int. Cl.
*H03K 19/0175* (2006.01)

(52) U.S. Cl. .......................................... 326/68; 326/81

(58) Field of Classification Search ................... 326/68, 326/80–87, 112, 119, 121
See application file for complete search history.

(56) References Cited

U.S. PATENT DOCUMENTS

| 6,456,110 B1* | 9/2002 | Elamanchili et al. ......... 326/68 |
| 2002/0084802 A1 | 7/2002 | Elamanchili et al. ......... 326/68 |

OTHER PUBLICATIONS

International PCT Search Report and Written Opinion, PCT/US/2009/067683, 13 pages, Mailed May 27, 2010.

* cited by examiner

*Primary Examiner*—Don P Le
(74) *Attorney, Agent, or Firm*—King & Spalding L.L.P.

(57) ABSTRACT

A conditional level shifter circuit is used to substantially eliminate sneak current from occurring in an integrated circuit device having two or more logic circuit modules in different voltage domains. Sneak current is caused when a signal between the two or more logic circuit modules in different voltage domains is at logic "0" and one of the logic circuit modules is biased at a voltage level above the true ground, $V_{SS}$, of the integrated circuit device. The conditional ground restoration circuit shifts the virtual ground logic "0" to the true ground level. This eliminates sneak current and logic level corruption.

19 Claims, 3 Drawing Sheets

HIGH SPEED CONDITIONAL BACK BIAS VIRTUAL GROUND RESTORATION CIRCUIT

RELATED PATENT APPLICATION

This application claims priority to commonly owned U.S. Provisional Patent Application Ser. No. 61/121,977; filed Dec. 12, 2008; entitled "High Speed Conditional Back Bias Virtual Ground Restoration Circuit," by Neil Deutscher, Jinhui Chen and Marquis Jones; and is hereby incorporated by reference herein for all purposes.

TECHNICAL FIELD

The present disclosure relates to integrated circuit devices having logic circuits capable of low power levels, and more particularly, to a ground restoration circuit (GRC) that substantially reduces sneak leakage current paths in the logic circuits caused when a logic "0" signal is asserted that is not at substantially true ground of the logic circuits, and is used to provide a logic "0" that is substantially true ground.

BACKGROUND

An integrated circuit device may electrically alter the threshold voltage of its NMOS transistors by raising the Vss power rail voltage above the bulk (e.g., well, tub, or substrate) voltage of the integrated circuit substrate (sometimes referred to as a "virtual ground"). This technique is commonly used to reduce the power consumption of the integrated circuit device due to sub-threshold leakage. Generally, the integrated circuit device will have two or more independent voltage domains to service respective logic circuits that have signal paths therebetween; some of these voltage domains may operate on the virtual ground, and other voltage domains may operate on true ground.

A problem exists in an integrated circuit device when a virtual ground of a signal source at a logic "0" is higher, e.g., more positive, than true ground, $V_{SS}$, in that a logic gate may sneak current and/or logic state corruption when a logic "0" signal to that logic gate does not have the ground level thereof restored to true ground.

SUMMARY

Therefore, a need exists for an apparatus that will substantially prevent sneak leakage current from occurring in the logic circuits of an integrated circuit device when a logic "0" signal is biased at a voltage level above the true ground, $V_{SS}$, of these logic circuits and restore the logic "0" level to the substantially true ground level.

A high speed conditional back bias virtual ground level shifter is disclosed herein. The standby e.g., sleep, control signal and previous status controls the sneak leakage path conditionally. The high speed conditional back bias virtual ground level shifter is advantageous for critical path or high speed communication signals.

According to a specific example embodiment of this disclosure, an integrated circuit device having conditional back bias virtual ground restoration circuits for preventing sneak leakage currents and shifting a virtual ground level logic "0" to a true ground level logic "0" when logic "0" signals at the virtual ground level are applied in the integrated circuit device comprises: at least one independent voltage domain operating at a virtual ground and at least one other independent voltage domain operating at a true ground, wherein the virtual ground is at a more positive voltage than the true ground; a plurality of conditional back bias virtual ground restoration circuits, each of the plurality of conditional back bias virtual ground restoration circuits is coupled between one of a plurality of first logic circuits operating in the virtual ground voltage domain and one of a plurality of second logic circuit operating in the true ground voltage domain, wherein the plurality of first and second logic circuits operating in the virtual and true ground voltage domains, respectively, are fabricated on an integrated circuit die, and wherein each of the plurality of ground restoration circuits comprises: a level shifter circuit having a logic input and a logic output, wherein the logic output follows logic levels at the logic input; and a switch transistor having a standby input, the switch transistor is coupled between the level shifter circuit and the true ground, wherein when the logic input is at logic "0" and the standby input is at logic "1" the switch transistor is off and prevents sneak leakage current through the level shifter circuit.

According to another specific example embodiment of this disclosure, an integrated circuit device having conditional back bias virtual ground restoration circuits for preventing sneak leakage currents and shifting a virtual ground level logic "0" to a true ground level logic "0" when logic "0" signals at the virtual ground level are applied in the integrated circuit device comprises: at least one independent voltage domain operating at a virtual ground and at least one other independent voltage domain operating at a true ground, wherein the virtual ground is at a more positive voltage than the true ground; a plurality of conditional back bias virtual ground restoration circuits, each of the plurality of conditional back bias virtual ground restoration circuits is coupled between one of a plurality of first logic circuits operating in the virtual ground voltage domain and one of a plurality of second logic circuit operating in the true ground voltage domain, wherein the plurality of first and second logic circuits operating in the virtual and true ground voltage domains, respectively, are fabricated on an integrated circuit die, and wherein each of the plurality of ground restoration circuits comprises: a first P-channel metal oxide semiconductor (PMOS) transistor (202) having a gate, source, drain and bulk; a second PMOS transistor (204) having a gate, source, drain and bulk; a first N-channel metal oxide semiconductor (NMOS) transistor (208) having a gate, source, drain and bulk; a second NMOS transistor (206) having a gate, source, drain and bulk; a third NMOS transistor (212) having a gate, source, drain and bulk; a fourth NMOS transistor (210) having a gate, source, drain and bulk; a first inverter (222) having an input and an output, wherein the first inverter (222) is coupled to the power source voltage and the virtual ground; a first NAND gate (216) having first and a second inputs and an output; a second NAND gate (218) having first and a second inputs and an output; the sources and bulk of the first PMOS transistor (202) and the second PMOS transistor (204) are coupled to the power source voltage; the drains of the first PMOS transistor (202) and the first NMOS transistor (208), the gate of the second PMOS transistor (204) and the first input of the first NAND gate (216) are coupled together; the drains of the second PMOS transistor (204) and second NMOS transistor (206), the gate of the first PMOS transistor (202) and the first input of the second NAND gate (214) are coupled together; the gate of the first NMOS transistor (208) and the input of the first inverter (222) are coupled to a logic signal from a logic circuit operating in the virtual ground voltage domain; the output of the first inverter (222) is coupled to the gate of the second NMOS transistor (206); the source of the first NMOS transistor (208) are coupled to the drain of the fourth NMOS transistor (212) and the bulk of the first NMOS transistor (208) is coupled to true ground; the source of the second NMOS transistor (206) are coupled to the drain of the third NMOS transistor (210) and the bulk of the second NMOS transistor (206) is coupled to true ground; the sources and bulks of the third NMOS transistor (210) and the fourth NMOS transistor (212) are coupled to the true ground; and the second inputs of the first and second NAND gates (216, 214) are coupled to a standby signal, wherein when the logic signal from the logic circuit is at logic "0" and the standby signal is at logic "1" the output of the first NAND gate (216) is at logic "0" whereby the fourth NMOS transistor (212) is off and thereby prevents sneak leakage current therethrough.

According to yet another specific example embodiment of this disclosure, a conditional back bias virtual ground restoration circuit for preventing sneak leakage currents and shifting a virtual ground level logic "0" to a true ground level logic "0" when a logic "0" signal at a virtual ground level is present comprises: a first P-channel metal oxide semiconductor (PMOS) transistor (202) having a gate, source, drain and bulk; a second PMOS transistor (204) having a gate, source, drain and bulk; a first N-channel metal oxide semiconductor (NMOS) transistor (208) having a gate, source, drain and bulk; a second NMOS transistor (206) having a gate, source, drain and bulk; a third NMOS transistor (212) having a gate, source, drain and bulk; a fourth NMOS transistor (210) having a gate, source, drain and bulk; a first inverter (222) having an input and an output, wherein the first inverter (222) is coupled to the power source voltage and the virtual ground; a first NAND gate (216) having first and a second inputs and an output; a second NAND gate (218) having first and a second inputs and an output; the sources and bulk of the first PMOS transistor (202) and the second PMOS transistor (204) are coupled to the power source voltage; the drains of the first PMOS transistor (202) and the first NMOS transistor (208), the gate of the second PMOS transistor (204) and the first input of the first NAND gate (216) are coupled together; the drains of the second PMOS transistor (204) and second NMOS transistor (206), the gate of the first PMOS transistor (202) and the first input of the second NAND gate (214) are coupled together; the gate of the first NMOS transistor (208) and the input of the first inverter (222) are coupled to a logic signal operating in the virtual ground voltage domain; the output of the first inverter (222) is coupled to the gate of the second NMOS transistor (206); the source of the first NMOS transistor (208) is coupled to the drain of the fourth NMOS transistor (212); the source of the second NMOS transistor (206) is coupled to the drain of the third NMOS transistor (210); the bulk of the first and second NMOS transistors (208, 206) are coupled to the true ground; the sources and bulks of the third NMOS transistor (210) and the fourth NMOS transistor (212) are coupled to the true ground; and the second inputs of the first and second NAND gates (216, 214) are coupled to a standby signal, wherein when the logic signal is at logic "0" and the standby signal is at logic "1" the output of the first NAND gate (216) is at logic "0" whereby the fourth NMOS transistor (212) is off and thereby prevents sneak leakage current therethrough.

BRIEF DESCRIPTION OF THE DRAWINGS

A more complete understanding of the present disclosure may be acquired by referring to the following description taken in conjunction with the accompanying drawings wherein.

Figure 1:
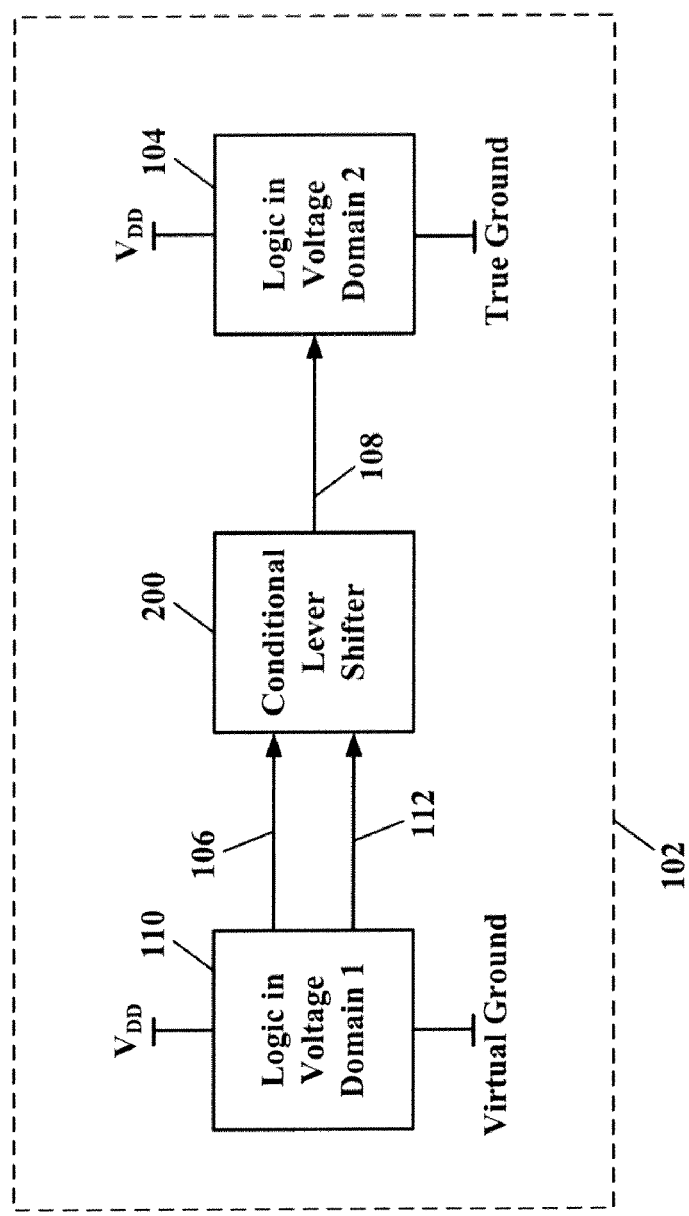
FIG. 1 is a schematic block diagram of an integrated circuit device comprising a conditional level shifter circuit coupled between two logic circuit modules having independent voltage domains, all fabricated on the integrated circuit device, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of an integrated circuit device comprising a conditional level shifter circuit coupled between two logic circuit modules having independent voltage domains, all fabricated on the integrated circuit device, according to the teachings of this disclosure. An integrated circuit device 102 comprises first logic circuits 110, a conditional level shifter circuit 200 and second logic circuits 104. The first logic circuits 110 are in a first voltage domain, and the second logic circuits 104 are in a second voltage domain. The first and second voltage domains may not have substantially the same common or ground voltage potential, e.g., the first voltage domain is at a virtual ground potential while the second voltage domain is at a true ground potential. The virtual and true ground potentials may be different enough wherein if a logic "0" signal is directly coupled between the first and second logic circuits 110 and 104, sneak current will occur in one or both of the first and second logic circuits 110 and 104.

Figure 2:
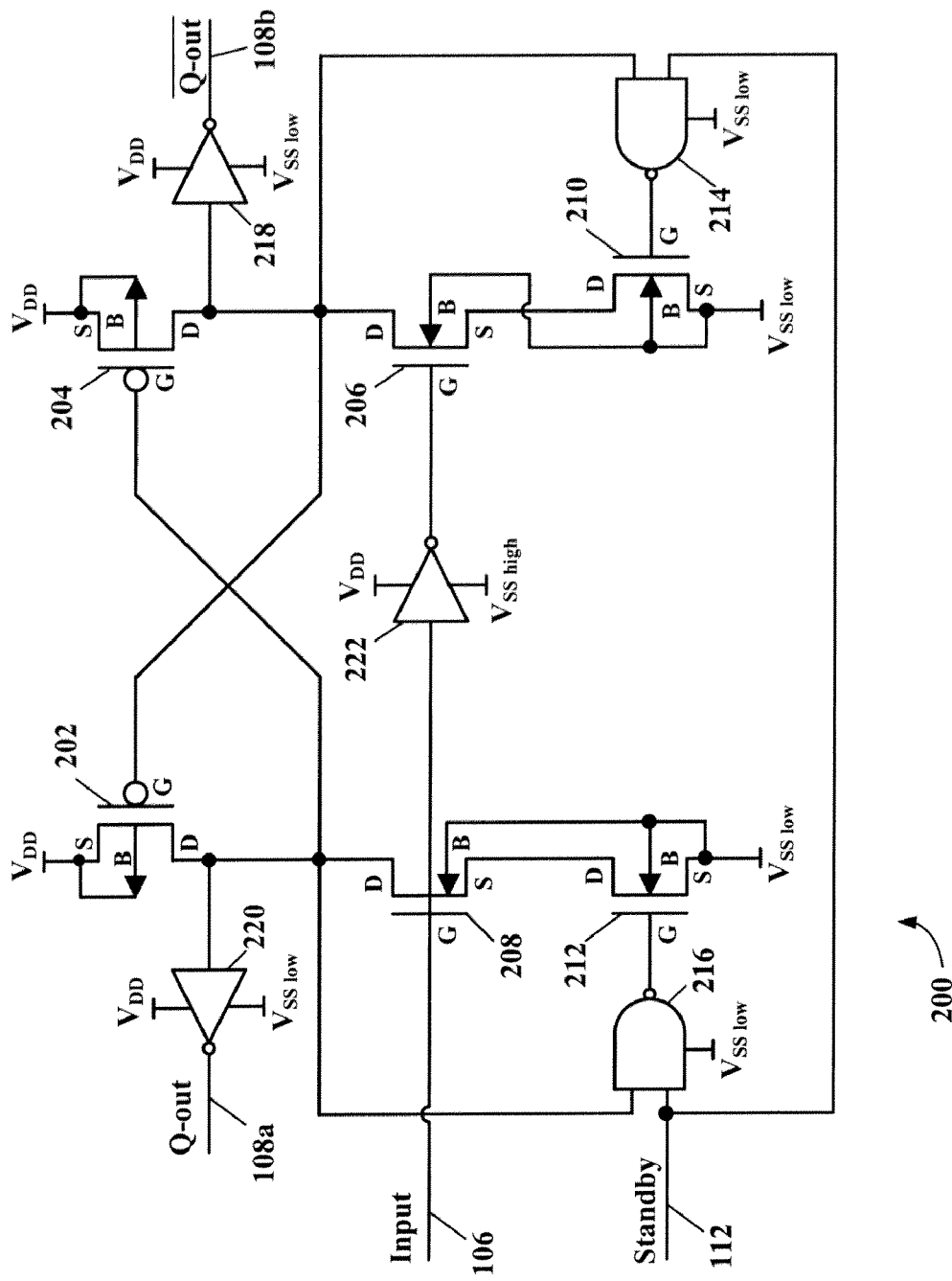
FIG. 2 is a schematic diagram of a conditional level shifter circuit that prevents sneak current when a signal at a logic "0" is biased at a voltage level above a true ground of an integrated circuit device, according to a specific example embodiment of this disclosure.
Figure 3:
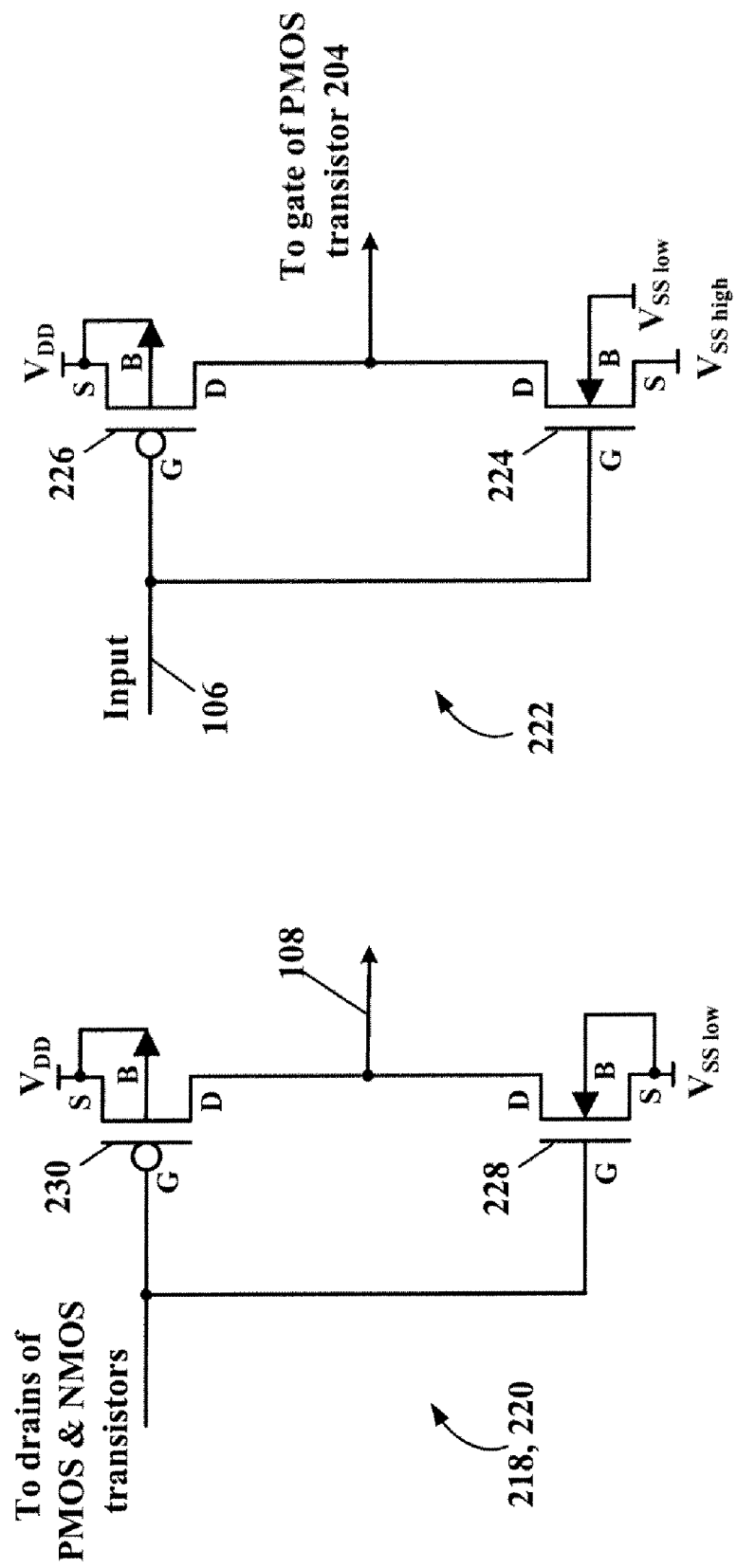
FIG. 3 is a schematic diagram of a portion of the conditional level shifter circuit shown in FIG. 2.

According to the teaching of this disclosure, when a signal on input 106 is at a logic "0" level that is biased above the true ground, $V_{SS}$, of the second logic circuits 104, the conditional level shifter circuit 200 will shift the logic "0" signal to a non-biased logic "0" level, or true ground, $V_{SS}$, and effectively block sneak leakage path current resulting from the shifted logic "0" input signal. A plurality of conditional level shifter circuits 200 may be implemented in the integrated circuit device 102, one for each of a plurality of second logic circuits 104 operating at the true ground, $V_{SS}$, as shown in FIGS. 1-3. A signal input 112 may be used to indicate when logic circuits of the integrated circuit device 102 are to go into a standby or sleep mode from a normal or operational mode.

Referring to FIG. 2, depicted is a schematic diagram of a conditional level shifter circuit that prevents sneak current when a signal at logic "0" is biased at a voltage level above a true ground of an integrated circuit device, according to a specific example embodiment of this disclosure. A virtual ground is always at a higher, e.g., more positive, voltage than is true ground, $V_{SS}$. Logic level signals on input 106 may be at substantially the power source voltage, $V_{DD}$, for logic "1" or at substantially virtual ground for logic "0". The signal voltage level at the input 106 is dependent upon the operational modes of the integrated circuit device 102, e.g., normal or standby (sleep) mode controlled by signal 112, as more fully described hereinbelow.

In a normal operation mode, the virtual ground of the signal source, e.g., first logic circuits 110, that is coupled to the signal line 106 may be substantially the same as $V_{SS}$. When in the standby mode (controlled by signal line 112) and having a back bias input, the virtual ground of the signal source coupled to the signal input 106 may be higher, e.g., more positive, than $V_{SS}$ when the signal from the signal source is at a logic low ("0").

$V_{SS\ low}$ represents the true ground (e.g., 0 volts). $V_{SS\ high}$ represents the virtual ground that is always higher (more positive) than the true ground, $V_{SS\ low}$. Virtual ground, $V_{SS\ high}$, may range from about 0 volts to several hundred millivolts (mV). When the signal input 106 is a logic high ("1"), the voltage at the input 106 is at substantially the power supply voltage, $V_{DD}$. However, when the signal input 106 is a logic low ("0"), the voltage at the input 106 may be from about 0 volts to the virtual ground voltage, $V_{SS\ high}$, depending on the operating mode selected, e.g., normal or standby mode controlled by the standby signal on input 112 of a logic low ("0") or a logic high ("1"), respectively.

Transistors 206 and 208 are N-channel metal oxide semiconductor (NMOS) transistors that are arranged in a differential input configuration. Inverter 222 provides differential signals to the inputs for the NMOS transistors 206 and 208. The inverter 222 is coupled to $V_{DD}$ and to a voltage at approximately the virtual ground. Transistors 202 and 204 are P-channel metal oxide semiconductor (PMOS) transistors. PMOS transistors 202 and 204 in combination with N-channel metal oxide semiconductor (NMOS) transistors 206 and 208 create a cross-coupled latch that holds the signal levels stable on the output nodes 108a and 108b. Inverters 218 and 220 provide load isolation to the output nodes 108b and 108a, respectively. Connections of each source, S; drain, D; gate, G; and bulk (e.g., well, tub, or substrate), B; of the transistors 202-212 are as shown in FIG. 2.

In the normal operation mode, virtual ground, $V_{SS\ high}$, is at substantially the same voltage as the true ground, $V_{SS\ low}$, both are at the true ground (e.g., 0 volts). The standby signal on input 112 is at logic "0" (true ground) and causes the outputs of the NAND gates 214 and 216 to a logic "1" that turns on NMOS transistors 210 and 212. In this normal operation mode, the conditional level shifter circuit 200 passes the input logic levels to the output substantially unchanged.

In the standby or sleep mode having a back bias input, virtual ground, $V_{SS\ high}$, can be at a voltage higher (more positive) than the true ground, $V_{SS\ low}$, e.g., by several hundred mV, for example 0.3 volts, when the input 106 is at logic "0." When input 106 is at about 0.3 volts, the node at the drain connections of the NMOS transistor 208 and the PMOS transistor 202 will be at a logic high "1" (e.g., substantially $V_{DD}$). However, the logic low signal on the input 106 will not be able to completely shut off the NMOS transistor 208 and will furthermore introduce a sneak leakage path to ground in a conventional lever shifter circuit.

According to the teachings of this disclosure, NMOS transistor 212 is added between the NMOS transistor 208 and the true ground, $V_{SS\ low}$, so as to conditionally control (shut off) any sneak leakage current path to the true ground, $V_{SS\ low}$, through NMOS transistor 208. This conditional operation is controlled by NAND gate 216 as follows: when the node at the drain connections of the NMOS transistor 208 and the PMOS transistor 202 is at a logic high "1" (substantially $V_{DD}$) and the standby signal on input 112 is at logic high "1" (substantially $V_{DD}$), the output of NAND gate 216 will be at logic low "0," effectively shutting off NMOS transistor 212 and thereby automatically preventing any sneak leakage current path therethrough. NMOS transistor 210 and NAND gate 214 operate in similar fashion when logic "1" is on the input 106 because the conditional level shifter circuit 200 shown in FIG. 2 is substantially symmetric. Therefore by introducing NMOS transistors 210 and 212, and NAND gates 214 and 216 connected as shown in FIG. 2, a sneak leakage current path is effectively eliminated, according to the teachings of this disclosure.

In standby mode, the ground restoration circuit (GRC) will shift virtual ground level logic "0" to true ground level logic "0".

It is contemplated and within the scope of this disclosure that other logic configurations can be used to control the NMOS transistors 210 and 212 for preventing sneak leakage currents. One having ordinary skill in the art of digital logic circuits and the benefit of this disclosure could readily design such other logic configurations.

Referring to FIG. 3, depicted is a schematic diagram of a portion of the conditional level shifter circuit shown in FIG. 2. The inverter 222 may comprise totem pole connected PMOS transistor 226 and NMOS transistor 224 coupled to the input 106 and the gate of the NMOS transistor 208. The inverters 218 and 220 may each comprise totem pole connected PMOS transistor 230 and NMOS transistor 228 coupled to the drains of the respective PMOS and NMOS transistors and having an output 108. Connections of each source, S; drain, D; gate, G; and (e.g., well, tub, or substrate), B; of the transistors 224, 226, 228 and 230 are as shown in FIG. 3.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device having conditional back bias virtual ground restoration circuits for preventing sneak leakage currents and shifting a virtual ground level logic "0" to a true ground level logic "0" when logic "0" signals at the virtual ground level are applied in the integrated circuit device, comprising:

at least one independent voltage domain operating at a virtual ground and at least one other independent voltage domain operating at a true ground, wherein the virtual ground is at a more positive voltage than the true ground;

a plurality of conditional back bias virtual ground restoration circuits, each of the plurality of conditional back bias virtual ground restoration circuits is coupled between one of a plurality of first logic circuits operating in the virtual ground voltage domain and one of a plurality of second logic circuit operating in the true ground voltage domain, wherein the plurality of first and second logic circuits operating in the virtual and true ground voltage domains, respectively, are fabricated on an integrated circuit die, and wherein each of the plurality of ground restoration circuits comprises:

a level shifter circuit having a logic input and a logic output, wherein the logic output follows logic levels at the logic input; and a switch transistor having a standby input, the switch transistor is coupled between the level shifter circuit and the true ground, wherein when the logic input is at logic "0" and the standby input is at logic "1" the switch transistor is off and prevents sneak leakage current through the level shifter circuit.

2. The integrated circuit device according to claim 1, wherein the switch transistor is on when the standby input is at logic "0".

3. The integrated circuit device according to claim 1, wherein the switch transistor is on when the logic input is at logic "1".

4. An integrated circuit device having conditional back bias virtual ground restoration circuits for preventing sneak leakage currents and shifting a virtual ground level logic "0" to a true ground level logic "0" when logic "0" signals at the virtual ground level are applied in the integrated circuit device, comprising:

at least one independent voltage domain operating at a virtual ground and at least one other independent voltage domain operating at a true ground, wherein the virtual ground is at a more positive voltage than the true ground;

a plurality of conditional back bias virtual ground restoration circuits, each of the plurality of conditional back bias virtual ground restoration circuits is coupled between one of a plurality of first logic circuits operating in the virtual ground voltage domain and one of a plurality of second logic circuit operating in the true ground voltage domain, wherein the plurality of first and second logic circuits operating in the virtual and true ground voltage domains, respectively, are fabricated on an integrated circuit die, and wherein each of the plurality of ground restoration circuits comprises:

a first P-channel metal oxide semiconductor (PMOS) transistor (202) having a gate, source, drain and bulk;

a second PMOS transistor (204) having a gate, source, drain and bulk;

a first N-channel metal oxide semiconductor (NMOS) transistor (208) having a gate, source, drain and bulk;

a second NMOS transistor (206) having a gate, source, drain and bulk;

a third NMOS transistor (212) having a gate, source, drain and bulk;

a fourth NMOS transistor (210) having a gate, source, drain and bulk;

a first inverter (222) having an input and an output, wherein the first inverter (222) is coupled to the power source voltage and the virtual ground;

a first NAND gate (216) having first and a second inputs and an output;

a second NAND gate (218) having first and a second inputs and an output;

the sources and bulk of the first PMOS transistor (202) and the second PMOS transistor (204) are coupled to the power source voltage;

the drains of the first PMOS transistor (202) and the first NMOS transistor (208), the gate of the second PMOS transistor (204) and the first input of the first NAND gate (216) are coupled together;

the drains of the second PMOS transistor (204) and second NMOS transistor (206), the gate of the first PMOS transistor (202) and the first input of the second NAND gate (214) are coupled together;

the gate of the first NMOS transistor (208) and the input of the first inverter (222) are coupled to a logic signal from a logic circuit operating in the virtual ground voltage domain;

the output of the first inverter (222) is coupled to the gate of the second NMOS transistor (206);

the source of the first NMOS transistor (208) are coupled to the drain of the fourth NMOS transistor (212) and the bulk of the first NMOS transistor (208) is coupled to true ground;

the source of the second NMOS transistor (206) are coupled to the drain of the third NMOS transistor (210) and the bulk of the second NMOS transistor (206) is coupled to true ground;

the sources and bulks of the third NMOS transistor (210) and the fourth NMOS transistor (212) are coupled to the true ground; and the second inputs of the first and second NAND gates (216, 214) are coupled to a standby signal, wherein when the logic signal from the logic circuit is at logic "0" and the standby signal is at logic "1" the output of the first NAND gate (216) is at logic "0" whereby the fourth NMOS transistor (212) is off and thereby prevents sneak leakage current therethrough.

5. The integrated circuit device according to claim 4, wherein the first PMOS transistor (202) and the second PMOS transistor (204) are configured as a cross-coupled latch.

6. The integrated circuit device according to claim 4, wherein the first inverter (222) comprises:

a third PMOS transistor (226) having a gate, source, drain and bulk; and a fifth NMOS transistor (224) having a gate, source, drain and bulk;

the gates of the third PMOS transistor (226) and the fifth NMOS transistor (224) are coupled to the signal from the logic circuit operating in the virtual ground voltage domain;

the source and bulk of the third PMOS transistor (226) are coupled to the power source voltage;

the source of the fifth NMOS transistor (224) is coupled to the virtual ground;

the bulk of the fifth NMOS transistor (224) is coupled to the true ground; and the drains of the third PMOS transistor (226) and the fifth NMOS transistor (224) are coupled to the gate of the second NMOS transistor (206).

7. The integrated circuit device according to claim 4, further comprising a second inverter (218) having an input coupled to the drains of the second PMOS transistor (204) and the second NMOS transistor (206), and an output.

8. The integrated circuit device according to claim 7, wherein the second inverter (218) comprises:

a fourth PMOS transistor (230) having a gate, source, drain and bulk; and a sixth NMOS transistor (228) having a gate, source, drain and bulk;

the gates of the fourth PMOS transistor (230) and the sixth NMOS transistor (228) are coupled to the drains of the second PMOS transistor (204) and the second NMOS transistor (206);

the source and bulk of the fourth PMOS transistor (230) are coupled to the power source voltage;

the source and bulk of the sixth NMOS transistor (228) are coupled to the true ground; and the drains of the fourth PMOS transistor (230) and the sixth NMOS transistor (228) are coupled as the output of the second inverter (218).

9. The integrated circuit device according to claim 8, further comprising a third inverter (220) having an input coupled to the drains of the first PMOS transistor (202) and the first NMOS transistor (208), and an output.

10. The integrated circuit device according to claim 9, wherein the third inverter (220) comprises:
a fifth PMOS transistor (230a) having a gate, source, drain and bulk; and
a seventh NMOS transistor (228a) having a gate, source, drain and bulk;
the gates of the fifth PMOS transistor (230a) and the seventh NMOS transistor (228a) are coupled to the drains of the first PMOS transistor (202) and the first NMOS transistor (208);
the source and bulk of the fifth PMOS transistor (230a) are coupled to the power source voltage;
the source and bulk of the seventh NMOS transistor (228a) are coupled to the true ground; and
the drains of the fifth PMOS transistor (230a) and the seventh NMOS transistor (228a) are coupled as the output of the third inverter (220).

11. The integrated circuit device according to claim 4, wherein the bulk is a well of the integrated circuit device.

12. The integrated circuit device according to claim 4, wherein the bulk is a tub of the integrated circuit device.

13. The integrated circuit device according to claim 4, wherein the bulk is a substrate of the integrated circuit device.

14. A conditional back bias virtual ground restoration circuit for preventing sneak leakage currents and shifting a virtual ground level logic "0" to a true ground level logic "0" when a logic "0" signal at a virtual ground level is present, comprising:
a first P-channel metal oxide semiconductor (PMOS) transistor (202) having a gate, source, drain and bulk;
a second PMOS transistor (204) having a gate, source, drain and bulk;
a first N-channel metal oxide semiconductor (NMOS) transistor (208) having a gate, source, drain and bulk;
a second NMOS transistor (206) having a gate, source, drain and bulk;
a third NMOS transistor (212) having a gate, source, drain and bulk;
a fourth NMOS transistor (210) having a gate, source, drain and bulk;
a first inverter (222) having an input and an output, wherein the first inverter (222) is coupled to the power source voltage and the virtual ground;
a first NAND gate (216) having first and a second inputs and an output;
a second NAND gate (218) having first and a second inputs and an output;
the sources and bulk of the first PMOS transistor (202) and the second PMOS transistor (204) are coupled to the power source voltage;

the drains of the first PMOS transistor (202) and the first NMOS transistor (208), the gate of the second PMOS transistor (204) and the first input of the first NAND gate (216) are coupled together;
the drains of the second PMOS transistor (204) and second NMOS transistor (206), the gate of the first PMOS transistor (202) and the first input of the second NAND gate (214) are coupled together;
the gate of the first NMOS transistor (208) and the input of the first inverter (222) are coupled to a logic signal operating in the virtual ground voltage domain;
the output of the first inverter (222) is coupled to the gate of the second NMOS transistor (206);
the source of the first NMOS transistor (208) is coupled to the drain of the fourth NMOS transistor (212);
the source of the second NMOS transistor (206) is coupled to the drain of the third NMOS transistor (210);
the bulk of the first and second NMOS transistors (208, 206) are coupled to the true ground;
the sources and bulks of the third NMOS transistor (210) and the fourth NMOS transistor (212) are coupled to the true ground; and
the second inputs of the first and second NAND gates (216, 214) are coupled to a standby signal,
wherein when the logic signal is at logic "0" and the standby signal is at logic "1" the output of the first NAND gate (216) is at logic "0" whereby the fourth NMOS transistor (212) is off and thereby prevents sneak leakage current therethrough.

15. The apparatus according to claim 14, wherein the first PMOS transistor (202) and the second PMOS transistor (204) are configured as a cross-coupled latch.

16. The apparatus according to claim 14, wherein the first inverter (222) comprises:
a third PMOS transistor (226) having a gate, source, drain and bulk; and
a fifth NMOS transistor (224) having a gate, source, drain and bulk;
the gates of the third PMOS transistor (226) and the fifth NMOS transistor (224) are coupled to the signal from the logic circuit operating in the virtual ground voltage domain;
the source and bulk of the third PMOS transistor (226) are coupled to the power source voltage;
the source of the fifth NMOS transistor (224) is coupled to the virtual ground;
the bulk of the fifth NMOS transistor (224) is coupled to the true ground; and
the drains of the third PMOS transistor (226) and the fifth NMOS transistor (224) are coupled to the gate of the second NMOS transistor (206).

17. The apparatus according to claim 14, wherein the bulk is a well of an integrated circuit device.

18. The apparatus according to claim 14, wherein the bulk is a tub of an integrated circuit device.

19. The apparatus according to claim 14, wherein the bulk is a substrate of an integrated circuit device.

* * * * *